United States Patent [19]

Agrawal et al.

[11] Patent Number: 5,365,528
[45] Date of Patent: Nov. 15, 1994

[54] METHOD FOR TESTING DELAY FAULTS IN NON-SCAN SEQUENTIAL CIRCUITS

[75] Inventors: Vishwani D. Agrawal, New Providence; Tapan J. Chakraborty, Mercerville, both of N.J.

[73] Assignee: AT&T Bell Laboratories, Murray Hill, N.J.

[21] Appl. No.: 862,942

[22] Filed: Apr. 3, 1992

[51] Int. Cl.$^5$ ............................................. G06F 11/00
[52] U.S. Cl. .................................. 371/25.1; 371/22.1; 371/23
[58] Field of Search .................... 371/25.1, 22.1, 23; 364/148, 149

[56] References Cited

U.S. PATENT DOCUMENTS

| | | | |
|---|---|---|---|
| 4,051,352 | 9/1977 | Eichelberger et al. | 364/716 |
| 5,305,328 | 4/1994 | Motohara et al. | 371/27 |
| 5,305,329 | 4/1994 | Sasaki | 371/27 |

OTHER PUBLICATIONS

Chakraborty et al., "Delay Fault Models & Test Generation for Random Logic Sequential Circuits", 1992, pp. 165-172, IEEE Design Automation Conf.
Agrawal et al., "Generating tests for Delay Faults in Nonscasn Circuits", 1993, pp. 20-28, IEEE Design & Test of Computers.
Chakraborty et al., "On Behavior Fault Modeling for Combinational Digital Designs", 1988, pp. 593-600. IEEE Int'l test Conf.
Chakraborty et al., "Path Delay Fault Simulation Algorithms for Sequential Circuits", 1992, pp. 52-56.
Cheng et al., "Gentest: An Automatic Test-Generation System for Sequential Circuits", Apr. 1989, pp. 43-48. IEEE Computer.
Hill, "Interlocked Test Generation & Digital Hardware Synthesis," 1991, pp. 52-56. IEEE.
Lee et al., "A New Test Generation Method for Sequential Circuits," 1991, pp. 446-449.
Bollinger et al., "An Investigation of Circuit Partitioning for Parallel Test Generation", IEEE VLSI Test Symposium 1992 pp. 119-124.
C. J. Lin and S. M. Reddy, "On Delay Fault Testing in Logic Circuits," *IEEE Trans. CAD*, vol. CAD-6, pp. 148-151, Sep. 1986.
Y. K. Malaiya and R. Narayanaswamy, "Modeling and Testing for Timing Faults in Synchronous Sequential Circuits," *IEEE Design and Test of Comput.*, vol. 1, pp. 62-74, Nov. 1984.
G. L. Smith, "Model for Delay Faults Based upon Paths," *Proc. Int'l Test Conf.*, pp. 342-349, 1985.
S. Davedas, "Delay Test Generation for Synchronous Sequential Circuits," Proc. Int'l Test Conf., pp. 144-152, Sep. 1989.

*Primary Examiner*—Robert W. Beausoliel, Jr
*Assistant Examiner*—Phillip F. Vales
*Attorney, Agent, or Firm*—Robert B. Levy

[57] ABSTRACT

To detect a delay fault along a signal path of interest (12) in a sequential digital circuit (10), a source flip-flop (14) and a destination flip-flop (16), proximate the beginning and end of the path, respectively, are designated in the circuit. Next, the signal path is activated to establish what logic values are necessary at the input of each of a set of combinational elements ($18_1$–$18_p$) in the path to propagate a selected signal transition from the source flip-flop to the destination flip-flop. A first and second backward justification process is carried out to synthesize a first sequence to propagate a selected logic value from a primary circuit input to the source flip-flop to cause it to generate the selected signal transition to propagate to the destination flip-flop. A second backward justification process is carried out to synthesize a second vector sequence which serves to propagate the value latched in the destination flip-flop to a primary output. The vectors of the first and second sequences are then applied at periodic intervals using a slow clock, except that the rated clock is applied to the last vector of the first sequence to propagate the logic value affected by the delay fault ultimately to the primary output. By comparing the value propagated to the primary output to the expected correct logic value, a determination can be made as to the existence of a delay fault.

8 Claims, 2 Drawing Sheets

METHOD FOR TESTING DELAY FAULTS IN NON-SCAN SEQUENTIAL CIRCUITS

TECHNICAL FIELD

This invention relates generally to a technique for detecting the presence of a delay fault along a signal path in a sequential digital circuit.

BACKGROUND OF THE INVENTION

Today's modern digital electronic circuits operate by propagating digital signals (binary "1's" and "0's") between different combinational elements (i.e., logic gates) and/or sequential elements (i.e., flip-flops). The proper operation of most digital circuits requires that signals propagate along various signal paths within the circuit during a predetermined interval, usually the period between successive clock signals. The failure of a signal to propagate along one or more such signal paths during a clock period usually gives rise to an error known as a delay fault.

Presently, the technique most commonly relied upon to verify the operation of a digital circuit is the so-called "stuck-at fault" test. The stuck-at fault test presumes that the faults, if any, in a digital circuit under test are characterized by a fixed signal level (a "1" or a "0") at an input or output of one or more elements in the circuit irrespective of all other signals in the circuit. Stuck-at fault testing is typically accomplished by successively applying each of a set of selected test vectors to the input(s) of the digital circuit to cause the circuit to generate a known response under normal (defect-free) operating conditions. Should one or more stuck-at faults exist (i.e., the signal at a terminal of one or more elements is "stuck at" a particular level), then the response to one or more of the vectors will differ from the expected response. While the stuck-at testing technique is useful for revealing most types of faults, the technique may not reveal all possible delay faults that may exist.

The increasing speed of today's digital circuits has led to an increased interest in establishing a more reliable technique for detecting the presence of delay faults. In his paper "Model for Delay Faults Based Upon Paths", published in the *Conference Proceedings of the International Test Conference* (1985), at pages 342-349, G. L. Smith proposes detecting delay faults along a signal path by propagating one of six values from a first set of latches to the logic portion of a circuit under test. A second set of latches is provided to hold the signature generated by the logic portion following propagation of the selective value. By determining whether a designated value has been propagated from the input latch to the output latch within a predetermined interval, a delay fault can be determined.

The technique of Smith presupposes that the input latches are directly accessible from a primary circuit input and that the output latches are directly observable from a primary circuit output. Unfortunately, many digital circuits do not conform to such an architecture. While it is possible to modify a non-conforming circuit to add the necessary latches required to practice the Smith technique, such a modification will lead to an increase in the circuit overhead which is undesirable.

Thus, there is a need for a technique for detecting delay faults which is suitable for a wide variety of digital circuits.

SUMMARY OF THE INVENTION

Briefly, in accordance with the invention, a technique is disclosed for detecting a delay fault along a signal path within a sequential digital circuit irrespective of its architecture. The technique is initiated by designating both a source flip-flop at the beginning of the signal path of interest, and a destination flip-flop at the end of the signal path so that the actual portion of the path along which the delay is to be measured lies between the two flip-flops. Next, the signal path of interest is activated. In other words, the logic values required to propagate a predetermined signal transition between the source and destination flip-flop is determined. Following path activation, a backward justification process is utilized to synthesize two vector sequences. The first vector sequence is established to propagate a predetermined logic value from a primary input to the source flip-flop in order to cause the flip-flop to generate a predetermined signal transition for propagation along the signal path of interest from the source to the destination flip-flop. The second vector sequence is established to propagate the value latched in the destination flip-flop to a primary output.

Actual delay fault testing is carded out by applying the vectors of the first sequence to latch the desired value into the source flip-flop and thereby cause the desired signal transition to propagate from the source flip-flop to the destination flip-flop. The second vector sequence serves to propagate the value latched into the destination flip-flop to a primary output for observation purposes. By comparing the actual value latched into the destination flip-flop to the value that should have been latched into the destination flip-flop at the end of the prescribed interval, a determination can be made whether a delay fault is present.

In practice, the first and second vector sequences are propagated while varying the clock frequency of the circuit, so that the circuit operates at rated speed only during the interval that the signal transition generated by the source flip-flop is propagated to the destination flip-flop along the path of interest. The clock speed of the circuit is reduced while propagating the predetermined logic value from a primary input to the source flip-flop and while propagating the value latched in the destination flip-flop to a primary output. By slowing the circuit clock during these intervals, the adverse influence of a delay fault (if any) on the corresponding parts of the testing procedure is greatly reduced.

DETAILED DESCRIPTION

Figure 1:
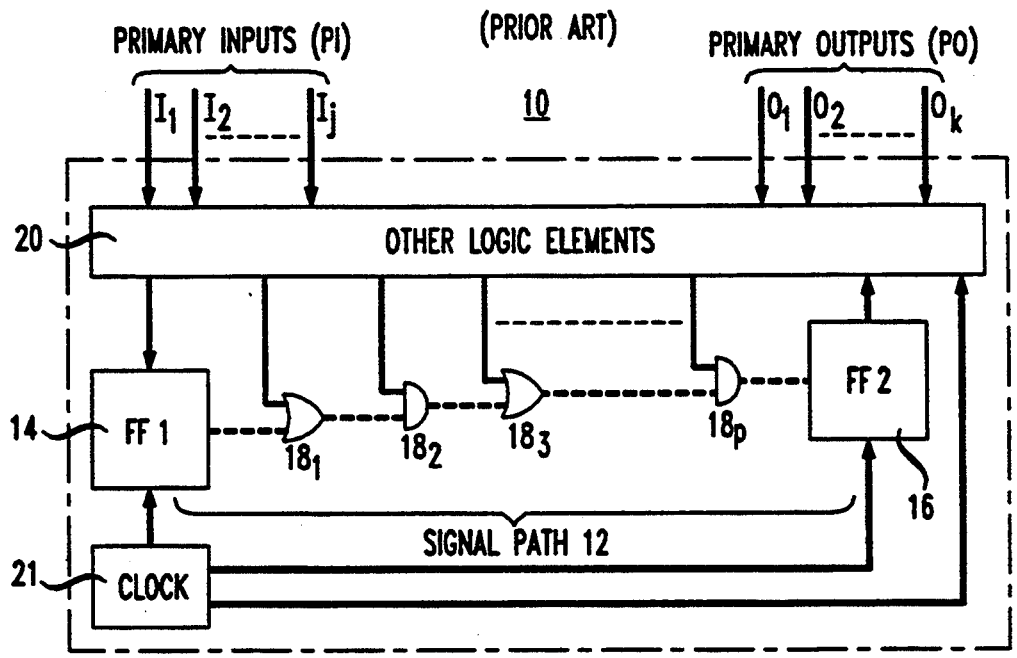
FIG. 1 is a block schematic diagram of a prior-art digital circuit having a signal path along which delay faults are to be detected.

FIG. 1 is a block schematic diagram of a prior art digital sequential circuit 10 having a plurality of primary inputs $I_1, I_2 \ldots I_j$ and a plurality of primary outputs $O_1, O_2 \ldots O_k$ where j and k are each integers being unity or greater. Within the circuit 10 is a signal path 12 of interest running between the output of a first flip-flop 14 and the input of a second flip-flop 16. Lying along the signal path 12 are one or more combinational elements $18_1, 18_2, 18_3 \ldots 18_p$ where p is an integer of unity or greater. In the illustrated embodiment, the element $18_1$ is depicted as an OR gate. The elements $18_2$ and $18_p$ are NAND gates while element $18_3$ comprises a NOR gate. As will be appreciated, the number and type of combinational elements lying within the signal path 12 is not critical to the method of the invention described below.

In addition to the flip-flops 12 and 14 and the combinational elements $18_1 - 18_p$, the digital circuit 10 also typically includes other combinational and/or sequential elements, which, for ease of illustration, have been collectively depicted in a single block 20. In accordance with signals supplied to the block 20 through one or more of the primary inputs $I_1 - I_j$, the block drives the first flip-flop 14 and also supplies signals to the combinational elements $18_1 - 18_p$. Specific signal values that activate the path have been described in the paper "On Delay Fault Testing in Logic Circuits," by C. J. Lin et al., published in the *IEEE Transactions on CAD*, Vol. CAD-6, pages 694–701, September 1987. Further, the output signal of the flip-flop 16 is supplied to the block 20 and serves to influence one or more of the output signals $O_1 - O_k$ generated thereby. The elements in the block 20, together with the source and destination flip-flops 14 and 16, respectively, are clocked by signals from a clock 21.

Proper operation of the circuit 10 requires that digital signals propagate along various signal paths within the circuit, including the signal path 12, during a predetermined interval, usually the period between successive signals from the clock 21. The failure of a signal to propagate along the signal path 12 (or along another such path) within this interval will give rise to an error known as a delay fault. In the past, detection of a delay fault along the signal path 12, for example, whose beginning and end points (the flip-flops 14 and 16, respectively) are not directly controlled by one of the primary inputs, has proven difficult.

Another difficulty in detecting delay faults within the circuit 10 is the problem of "hazards", that is, timing anomalies attributable the analog operation of elements along the signal path of interest (i.e., the path 12). Hazards are the unintentional transition between steady states of a signal caused by delays of circuit elements. For example, the presence of a hazard can destroy predetermined values as they are propagated from one or more of the primary inputs $I_1 - I_j$ through the block 20 to the elements $18_1 - 18_p$ and to the flip-flops 14 and 16. The absence of hazards in testing can make such tests effective in the detection of the target delay faults, irrespective of all other delays in the circuit. Such a test is called "robust."

In accordance with the invention, there is provided a unique algebra which facilitates the computation of robust (hazard-free) test sequences to detect delay faults. To facilitate an understanding of our unique algebra, the term "transition state," as used hereinafter, means the transition of a logic signal (i.e., a binary "0" or "1" or a don't-care value represented by "X") during a clock period. With three possible signal states, there will be nine possible transition states. Taking into account the presence of hazards, the nine transition states must be represented by eighteen values (hazard and no-hazard conditions for each transition). The eighteen possible values will collapse into thirteen unique values, each represented by a triplet, for example 1|h|0 representing the transition from a 1 to a 0 with the presence of a hazard, while 0|nh|1 represents a transition from a 0 to a 1 with no hazard. If a don't-care value (represented by a X) is present in either the first or second time frame (i.e., the first or third position of a triplet), then a don't-care or indeterminate hazard condition is represented by a ~ in between frames. Table I below represents a truth table for a two-input AND gate (not shown) while Table II contains the definition of the numeric codes found in Table I. Note that if either of the inputs of the AND gate, as represented by the first row and first column, respectively, has a hazard condition present, then the output will also have a hazard condition.

TABLE I

Truth Table for a Two-Input AND Gate

|    | 1  | 2  | 3  | 4  | 5  | 6  | 7  | 8  | 9  | 10 | 11 | 12 | 13 |
|----|----|----|----|----|----|----|----|----|----|----|----|----|----|
| 1  | 1  | 1  | 1  | 1  | 1  | 1  | 1  | 1  | 1  | 10 | 1  | 1  | 1  |
| 2  | 1  | 2  | 3  | 1  | 2  | 3  | 1  | 2  | 3  | 10 | 2  | 2  | 1  |
| 3  | 1  | 3  | 3  | 1  | 3  | 3  | 1  | 3  | 3  | 10 | 3  | 3  | 1  |
| 4  | 1  | 1  | 1  | 4  | 4  | 4  | 7  | 7  | 7  | 10 | 1  | 4  | 4  |
| 5  | 1  | 2  | 3  | 4  | 5  | 6  | 7  | 8  | 9  | 10 | 2  | 5  | 4  |
| 6  | 1  | 3  | 3  | 4  | 6  | 6  | 7  | 9  | 9  | 10 | 3  | 6  | 4  |
| 7  | 1  | 1  | 1  | 7  | 7  | 7  | 7  | 7  | 7  | 10 | 1  | 7  | 7  |
| 8  | 1  | 2  | 3  | 7  | 8  | 9  | 7  | 8  | 9  | 10 | 2  | 8  | 7  |
| 9  | 1  | 3  | 3  | 7  | 9  | 9  | 7  | 9  | 9  | 10 | 3  | 9  | 7  |
| 10 | 10 | 10 | 10 | 10 | 10 | 10 | 10 | 10 | 10 | 10 | 10 | 10 | 10 |
| 11 | 1  | 2  | 3  | 1  | 2  | 3  | 1  | 2  | 3  | 10 | 11 | 11 | 1  |
| 12 | 1  | 2  | 3  | 4  | 5  | 6  | 7  | 8  | 9  | 10 | 11 | 12 | 13 |
| 13 | 1  | 1  | 1  | 4  | 4  | 4  | 7  | 7  | 7  | 10 | 1  | 13 | 13 |

TABLE II

| Values  | Code Definition Codes | Values    | Codes |
|---------|-----------------------|-----------|-------|
| 0\|h\|0  | 1  | X\|\|1    | 8  |
| 0\|h\|1  | 2  | X\|\|X    | 9  |
| 0\|\|X   | 3  | 0\|nh\|0  | 10 |
| 1\|h\|0  | 4  | 0\|nh\|1  | 11 |
| 1\|h\|1  | 5  | 0\|nh\|1  | 12 |
| 1\|\|X   | 6  | 1\|nh\|0  | 13 |
| X\|\|0   | 7  |           |    |

Figure 2:
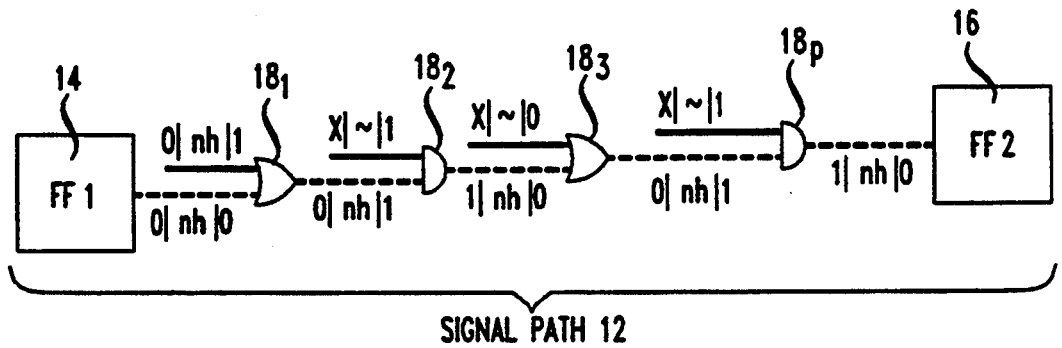
FIG. 2 is a block schematic diagram of the signal path of interest of FIG. 1, showing how the path has been activated in accordance with the invention.

A better understanding of our thirteen-value algebra may be had by reference to FIG. 2, which is a block schematic diagram of the signal path 12 of FIG. 1, and the devices lying along it (i.e., the flip-flops 14 and 16 and the elements $18_1 - 18_p$). For purposes of explanation, a 0-to-1 transition, with no hazard, is assumed at the output of the flip-flop 14 for propagation to the input of flip-flop 16. An appropriate one of the triplets of our thirteen-value algebra has been used in FIG. 2 to indicate the manner in which such a 0-to-1 transition propagates from the flip-flop 14, through the elements $18_1 - 18_p$, to the flip-flop 16. The logic value supplied from the block 20 (see FIG. 1) to each of the elements $18_1 - 18_p$ has also been represented by an appropriate triplet. With our thirteen-value algebra, only the input of the destination flip-flop 16 in the signal path 12 needs to be examined at the end of each vector simulation to determine if the test is robust or not. This signal representation is more explicit in our hazard notation as compared to that described in the Lin et al. paper, or in the Smith paper cited previously.

Figure 3:
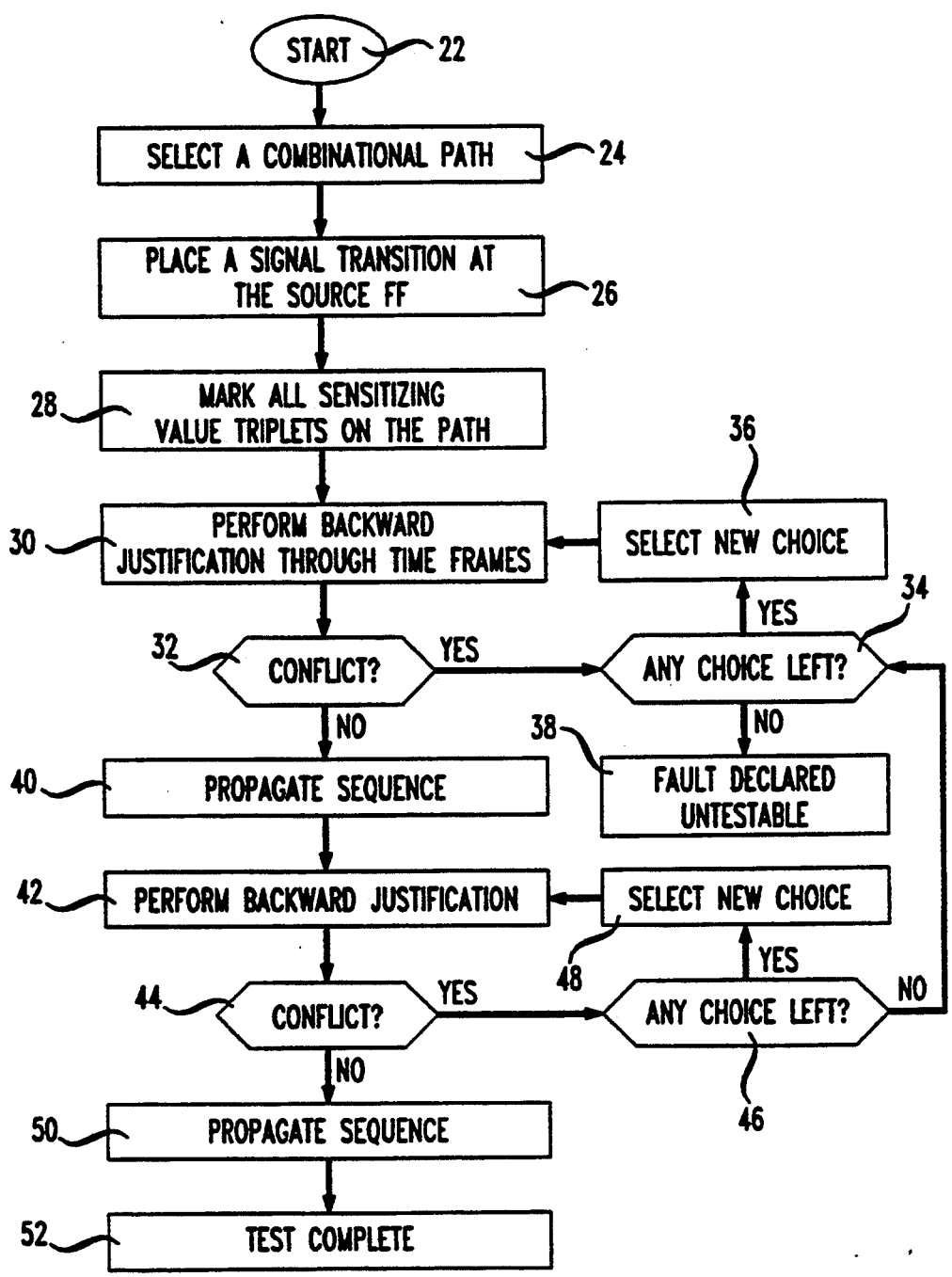
FIG. 3 is a flowchart representation of a method, in accordance with the present invention, for generating test vectors for detecting delay faults in the signal path of FIG. 1.

Referring to FIG. 3, there is shown, in flowchart form, a method in accordance with the invention for generating vector sequences to detect delay faults (if any) in the signal path 12. The fault-detection method of FIG. 3 is initiated upon execution of a start instruction (step 22) whereupon an initialization operation is completed, so that values previously set in connection with a prior execution of the method are now set to a predetermined initial value. Following the start instruction, step 24 is executed and a particular path, extending between a source and destination flip-flops within the circuit 10, is selected for fault detection. In the illustrated embodiment, the signal path 12 is assumed to have been selected, with the flip-flops 14 and 16 designated as the source and destination flip-flops, respectively. The signal path selected during step 24 may be chosen using the criterion of longest delay time or any other criterion.

Once the signal path has been selected, then a particular signal transition is selected for generation by the source flip-flop 14 of FIGS. 1 and 2 (step 26). In other words, during step 26, the desired type of signal transition, which should appear at the output of the flip-flop 14 at interval (say, $T_n$) when the delay fault measurement should commence, is selected. Next, step 28 is executed, and the signal transition at the input of each of the elements $18_1$–$18_p$ of FIGS. 1 and 2, required for the signal transition generated by the flip-flop 14 to propagate to the flip-flop 18 of FIGS. 1 and 2, is designated, using our thirteen-value algebra, as described earlier with respect to Tables I and II. Thereafter, step 30 is executed and a backward justification is carried out over several time frames (typically $T_1, T_2 \ldots T_{n-1}, T_n$) to generate a vector sequence which, when input to the primary input(s) $I_1$–$I_j$ of the circuit 10 of FIG. 1, causes the logic transition selected during step 26 of FIG. 3 to be generated by the source flip-flop 14 and to propagate therefrom to the destination flip-flop 16. The general process of backward justification is well known, and for a further discussion on backward time justification, reference should be had to the text *Digital Logic and Test Simulation*, by Alexander Miczo (Harper & Row, 1986), pages 25–28, and to the paper "The Back Algorithm for Sequential Test Generation" by Wu Tung Cheng, published with *Conference Proceedings, International Conference of Computer Design*, Oct. 1988, Rye, N.Y., at pages 626–629.

Following step 30, a check is made during step 32 to determine whether any conflicts occurred during the backward justification process just performed. During the process of backward justification, certain logic values are presumed in each time frame to establish a particular set of logic values required in the next subsequent frame. During the process, a conflict may occur between the logic value presumed to exist during a particular time frame and a value for an earlier frame. If such a conflict is found, then step 34 is executed and a determination is made whether there are other possible choices (i.e., other possible presumptions) that can be made during the backward justification process. If so, then step 36 is executed and a new choice is selected. Should no new choice be possible, then no vector sequence can be synthesized during the backward justification process which can propagate the desired logic value. Thus, following a determination that a conflict exists and that no other choices are available, a notification is generated during step 38 that the selected signal path cannot be tested for a delay fault.

When no conflict is found during step 32, then the vector sequence established during the backward justification process of step 30 is propagated from the primary inputs $I_1$–$I_j$ to the source flip-flop 14 of FIGS. 1 and 2, and from there to the destination flip-flop 16 of FIGS. 1 and 2 (step 40). The speed of the clock 21 of FIG. 1 is reduced, typically to half of its rated speed, as the vectors in the first sequence are propagated to latch the desired logic value from the primary inputs $I_1$–$I_j$ of the circuit 10 of FIG. 1 to the source flip-flop 14. The reason for reducing the clock speed is to assure that delay faults (if any) within the block 20 of FIG. 1 do not impair propagation of the desired logic values from one of more of the primary inputs $I_1$–$I_j$ to the source flip-flop 14. Once the desired logic value has been latched into the source flip-flop 14, then the clock speed is increased to the rated speed so that propagation of the desired logic transition from the source flip-flop to the destination flip-flop 16 occurs at such a rate.

Following step 40, a second backward justification process is carried out (step 42) to establish a second vector sequence, which, when applied to the primary inputs $I_1$–$I_j$ of the circuit 10 of FIG. 1, will propagate the logic value latched in the destination flip-flop 16 to one of the primary outputs $O_1$–$O_k$. The backward justification carried out during step 42 is much the same as the one carded out during step 30. After step 42, a determination is made during step 44 as to whether any conflicts occurred during the second backward justification process. Should a conflict be found during step 44, then a determination is made as to whether any alternative choices (i.e., any different assumptions) can be made during the second backward justification process. If so, then a new such choice is made (step 48) and step 42 is repeated. Should no other choices be possible, then step 34 is re-executed to determine if other possible choices can be made during the first backward justification process performed during step 30.

When no conflicts have been found during step 44, then the second vector sequence, as established during the second backward justification process of step 42, is generated (step 50). In this way, the logic value previously latched into the destination flip-flop 16 is propagated to one of the primary outputs $O_1$–$O_k$ of the circuit 10 of FIG. 1 for observation. As the vectors of the second sequence are propagated, the speed of the clock 21 of FIG. 1 is again reduced so that delay faults, if any, occurring within the block 20, do not adversely affect observation of the logic transition latched into the flip-flop 16 at one of the primary outputs $O_1$–$O_k$ of the circuit 10. By observing whether the value appearing at the appropriate primary output from the destination flip-flop 16 corresponds to the value appearing originally latched into the source flip-flop 14, a determination can be made whether a delay fault exists. Following propagation of the second vector sequence during step 50, the testing process ends with notification that the test is complete (step 52).

As discussed above, the speed of the clock 21 of FIG. 1 is adjusted during propagation of the first and second vector sequences during steps 40 and 50 of FIG. 3. This may be better understood by reference to FIG. 4, which depicts a plurality of boxes 10' (each representing the entire circuit 10 of FIG. 1, except the flip-flops 14 and 16) at each of a plurality of separate time intervals commencing at time $T_1$ and ending at $T_{n+m}$, some n+m clock periods later where n and m are each integers. The notations PI and PO in FIG. 4 have been used to collectively represent the primary inputs $I_1$–$I_j$ and primary outputs $O_1$–$O_k$, respectively, of the circuit 10 of FIG. 1.

Figure 4:
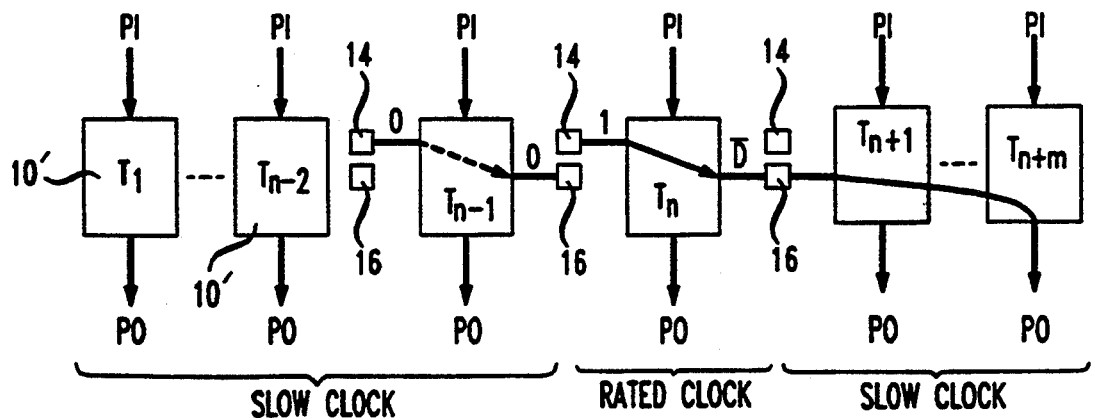
FIG. 4 is logic array model of the signal path of FIG. 1 showing the state of various elements during each of a set of successive time intervals during delay fault detection.

Referring to FIG. 4, it is assumed that a 0-to-1 logic transition is to be propagated from the flip-flop 14 to the flip-flop 16 during the interval $T_n$ for fault measurement purposes. Prior to this interval, the combinational elements (not shown) in the non-flip-flop circuit portion 10', together with the flip-flops 14 and 16, are clocked so that the flip-flop 14 produces a "0" during the interval $T_{n-1}$ and a "1" during the interval $T_n$. The "0" produced by the flip-flop 14 during the interval $T_{n-1}$ is assumed to propagate to the flip-flop 16 by the end of this interval to reset it.

The real interval of interest is $T_n$ when flip-flop 14 transitions from a 0 to a 1 to induce the flip-flop 16 to transition from a 0 to a 1. During this interval, the clock speed is held at the rated speed. In this way, a delay fault along the signal path 12 of FIG. 1 can be detected by determining whether the flip flop 16 has indeed undergone a transition within the interval $T_n$. Yet, until the time interval $T_n$, the clock speed is unimportant. Indeed, keeping the clock speed at the rated speed during each of the intervals from $T_1$–$T_{n-1}$ may induce a delay fault in the non-flip-flop circuit portion 10' which could interfere with the flip-flop 14 undergoing a 0-to-1 transition during the interval $T_{n-1}$. For this reason, the speed of the clock 21 of FIG. 1 is reduced, typically to half its normal speed, during the interval between $T_1$–$T_{n-1}$.

During the interval from $T_{n+1}$ through $T_{n+m}$, while the vectors of the second vector sequence are applied to cause the value previously latched in the flip-flop 16 to appear at one of the primary outputs, the speed of the clock 21 of FIG. 1 is also reduced. Again, the reason for reducing the clock speed during this time is to prevent any delay fault in the circuit from adversely affecting the test results.

The foregoing describes a technique for detecting a delay fault within a signal path 12 in a digital circuit 10. The robustness and fault coverage of the delay fault test obtained by the foregoing method depends on assumptions made at the beginning of the second vector sequence as to the initial state of the flip-flops 14 and 16 as well as others (not shown) which may be present in the circuit 10 of FIG. 1. If all of the flip-flops other than the destination flip-flop 16 are to be presumed unaffected by an excessive delay along the signal path 12 or any other path in the circuit, fairly high fault coverage can be obtained. However, the test results will not be robust from the standpoint that specific delay patterns may invalidate the result. A more conservative approach is to assume that the initial state of all flip-flops except the destination flip-flop 16 is a don't-care value (X) at the time $T_{n+1}$. Flip-flops that have steady signal values (without hazard) during the rated clock application may retain their 1 or 0 state. Also the flip-flop 16 is assumed to have latched a value D or $\bar{D}$ containing the effect of the delay fault. Here, the notation D means the correct value is a 1 and the faulty value is a 0. $\bar{D}$ represents the converse condition. The path 12 of FIG. 2 causes a $\bar{D}$ to be latched in the flip-flop 16. This is because when the delay of the path 12 is small, the final state of the flip-flop 16 will be 0. But due to the 1|nh|0 transition arriving at the flip-flop 16, when this delay is larger than the rated clock period, the value latched will be 1. The fault coverage obtained under these conditions is less but the test results are robust, as the vectors generated under these conditions are guaranteed to be correct, even if the other flip-flop states are affected by delays. The most conservative approach is to assume that all flip-flops whose states help propagate the fault effect from flip-flop 16 to a primary output are held unchanged without hazard during and one vector prior to the transition propagation phase. Under these conditions, a delay fault or hazard will not affect the states of any flip-flop other than the destination flip-flop. Under this set of conditions successful generation of the vector sequences may not be possible, but if so, a robust test can be achieved.

It is to be understood that the above-described embodiments are merely illustrative of the principles of the invention. Various modifications and changes may be made thereto by those skilled in the art which will embody the principles of the invention and fall within the spirit and scope thereof.

We claim:

1. A method for detecting whether a signal transition has propagated within a prescribed interval along a signal path of interest in a digital circuit having at least one primary input and at least one primary output, and including a plurality of flip-flops, comprising the steps of:

designating a first (source) flip-flop in the digital circuit which is proximate to a first end of the signal path of interest and a second (destination) flip-flop which is proximate a second end of the signal path of interest;

activating the signal path to establish what logic value is necessary at each of a plurality of intermediate portions of the signal path in order for a selected signal transition to propagate from the source flip-flop to the destination flip-flop performing a first backward justification, in accordance with the activation of the signal path, to synthesize a first sequence of vectors which, when applied to the primary input, serves to propagate a selected logic value from the primary input to the source flip-flop to cause the source flip-flop to generate the selected logic transition and to propagate the signal transition to the destination flip-flop so that a logic value is latched therein;

performing a second backward justification, in accordance with the activation of the signal path, to synthesize a second sequence of vectors, which, when applied to the primary input, serves to propagate the logic value that has been latched into the destination flip-flop to the primary output;

periodically applying a successive one of the vectors of the first sequence to the primary input such that the selected logic value is propagated from the primary input to the source flip-flop, and that the selected signal transition is generated by the source flip-flop and propagates therefrom to the destination flip-flop within the predetermined interval in the absence of a delay fault;

periodically applying a successive one of the vectors of the second sequence to the primary input to cause the destination flip-flop to propagate the logic value that has been latched therein following application of the first sequence of vectors to the primary output; and comparing the logic value propagated to the primary output to the preselected logic value to determine if a delay fault is present.

2. The method according to claim 1 wherein the vectors of the first sequence are applied to the primary inputs at different speeds so that the speed at which the selected logic value propagates from the primary input to the source flip-flop is slower than the speed at which the selected signal transition propagates from the source flip-flop to the destination flip-flop.

3. The method according to claim 2 wherein the vectors of the second sequence are applied to the primary input at such a speed that the propagation of the logic value which has been latched in the destination flip-flop to the primary output is slower than the propagation of the selected signal transition from the source flip-flop to the destination flip-flop.

4. The method according to claim 1 including the steps of:
checking whether any conflicts arise during the first backward justification process; and if so
re-executing the first backward justification process to eliminate all conflicts if possible; otherwise
declaring an untestable fault condition when conflict elimination is not possible.

5. The method according to claim 4 further including the steps of:
checking whether any conflicts arise during the second backward justification process; and if so
re-executing the second backward justification process to eliminate all conflicts if possible; otherwise
re-executing the first backward justification process to eliminate all conflicts if possible; otherwise
declaring an untestable fault condition when conflict elimination is not possible.

6. The method according to claim 1 wherein only the source flip-flop and destination flip-flops are affected by a delay along the signal path of interest.

7. The method according to claim 1 wherein each flip-flop in the circuit (excepting the one designated as the destination flip-flop and those maintaining steady state values without hazard during transition propagation through the path of interest) has a don't care value latched therein immediately after propagation of the selected signal transition from the source to the destination flip-flop.

8. The method according to claim 1 wherein each flip-flop in the circuit that must assume a signal value immediately after propagation of the selected signal transition from the source flip-flop to the destination flip-flop in order to propagate the state of the destination flip-flop to a primary output, must maintain that signal value without hazard during the last two vectors of the first sequence.

* * * * *